United States Patent
Takeda et al.

(10) Patent No.: US 8,368,972 B2
(45) Date of Patent: Feb. 5, 2013

(54) SURFACE-EMITTING SEMICONDUCTOR LASER, SURFACE-EMITTING SEMICONDUCTOR LASER DEVICE, OPTICAL TRANSMISSION APPARATUS, AND INFORMATION PROCESSING APPARATUS

(75) Inventors: Kazutaka Takeda, Kanagawa (JP); Hideo Nakayama, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 69 days.

(21) Appl. No.: 13/190,022

(22) Filed: Jul. 25, 2011

(65) Prior Publication Data
US 2012/0170084 A1 Jul. 5, 2012

(30) Foreign Application Priority Data
Jan. 5, 2011 (JP) .................................. 2011-000380

(51) Int. Cl.
*H04N 1/04* (2006.01)
*H04N 1/46* (2006.01)

(52) U.S. Cl. .......................... 358/480; 358/508; 358/513

(58) Field of Classification Search ........................ None
See application file for complete search history.

(56) References Cited

FOREIGN PATENT DOCUMENTS

| EP | 1 130 720 A1 | 9/2001 |
| EP | 1 130 720 BI | 4/2005 |
| JP | A-2001-156395 | 6/2001 |
| JP | A-2006-210429 | 8/2006 |
| JP | A-2010-153768 | 7/2010 |
| WO | WO 2010/061947 | 6/2010 |

*Primary Examiner* — Thierry Pham
(74) *Attorney, Agent, or Firm* — Oliff & Berridge, PLC

(57) ABSTRACT

A surface-emitting semiconductor laser includes a substrate, a first semiconductor multi-layered reflector of a first conductivity type, an active region, a second semiconductor multi-layered reflector of a second conductivity type, a columnar structure, a current-confining layer including a conductive area surrounded with an oxidized area, a first electrode defining a light-emitting window, a first dielectric film covering the light-emitting window, and a second dielectric film formed on the first dielectric film. The second dielectric film has an asymmetrical shape having a long axis and a short axis, the second dielectric film is located at a position overlapping with the conductive area, the second refractive index $n_2$ is greater than the first refractive index $n_1$, the thickness of the first dielectric film is an odd multiple of $\lambda/4 \cdot n_1$ ($\lambda$: oscillation wavelength), and the thickness of the second dielectric film is an odd multiple of $\lambda/4 \cdot n_2$.

14 Claims, 8 Drawing Sheets

| FIRST DIELECTRIC FILM | SECOND DIELECTRIC FILM |
|---|---|
| SiON | $TiO_2$ |
| $SiO_2$ | $TiO_2$ |
| $SiO_2$ | SiN |
| SiN | $TiO_2$ |

10A VCSEL

FIG. 4
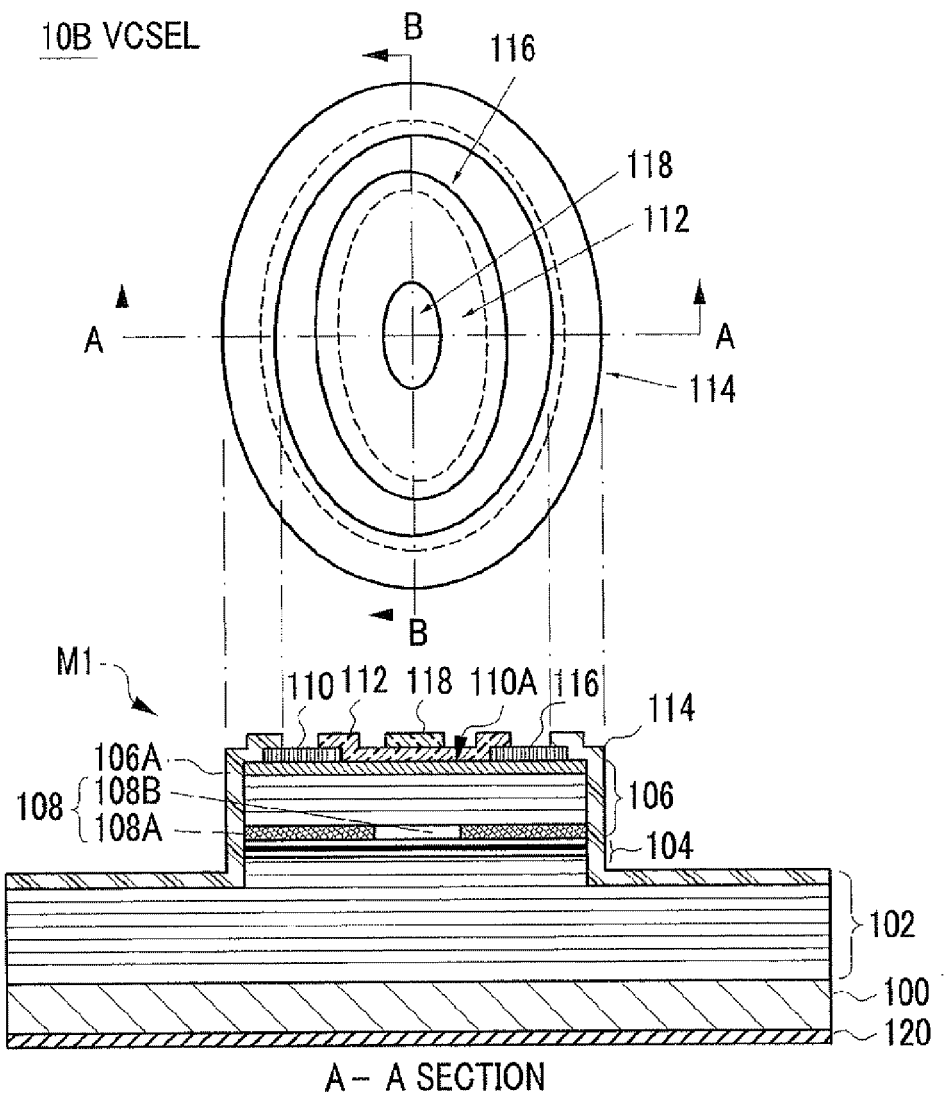
A-A SECTION
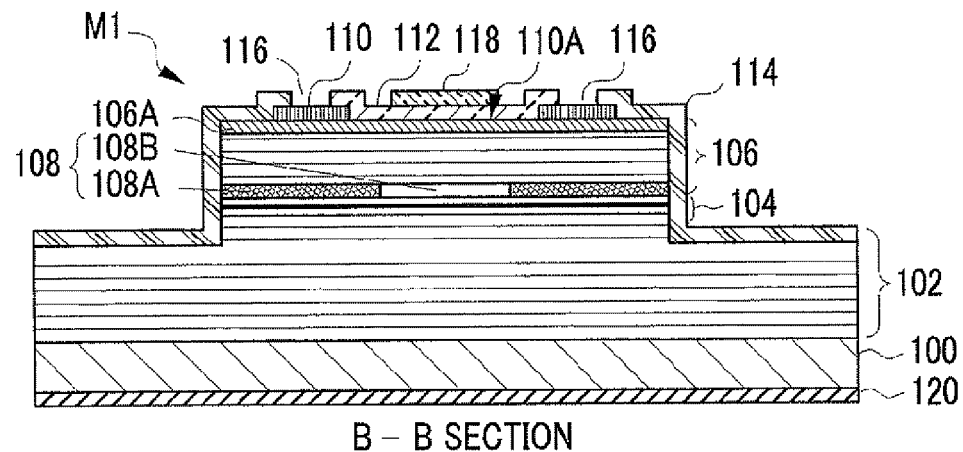
B-B SECTION

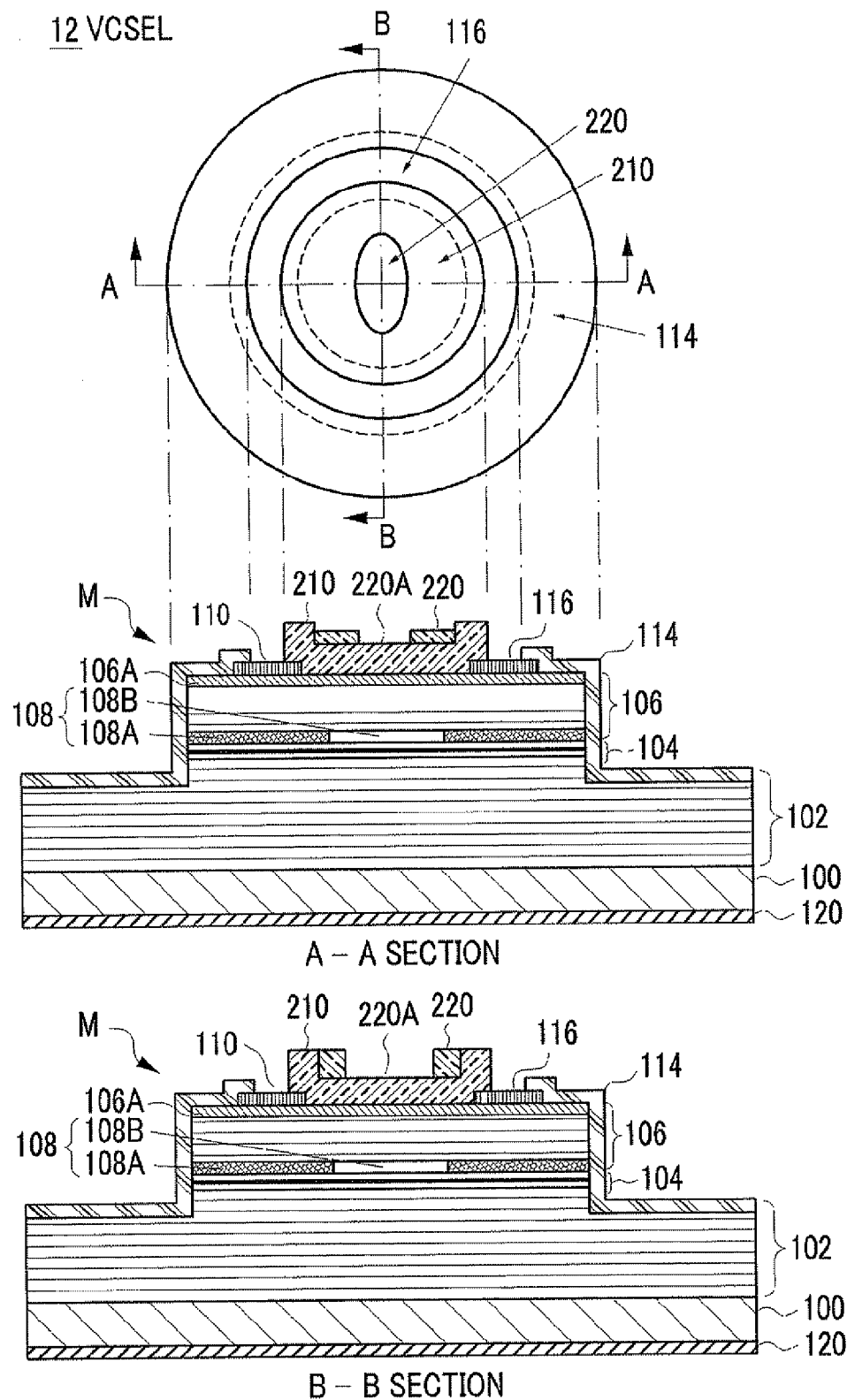

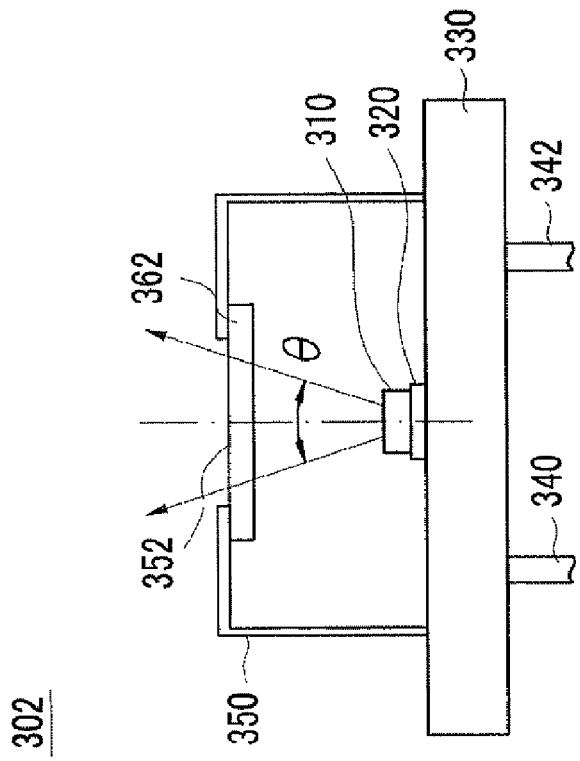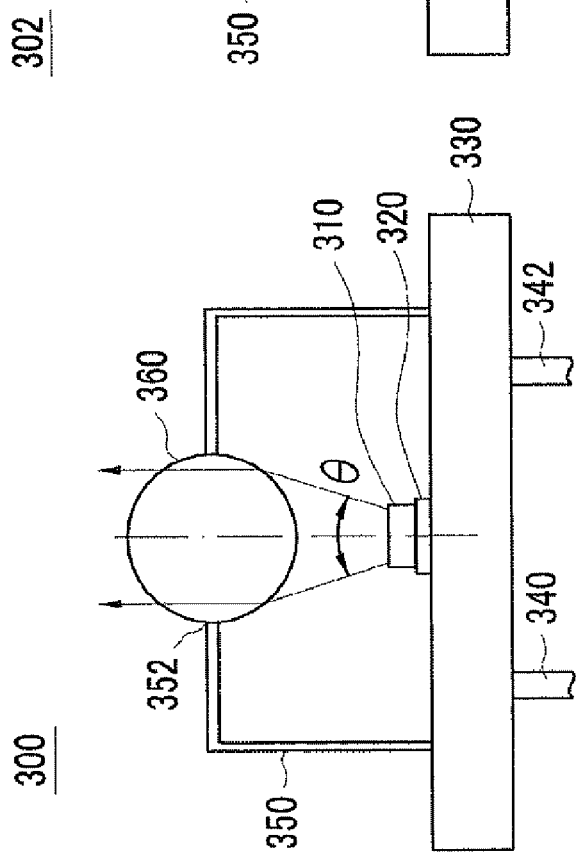

SURFACE-EMITTING SEMICONDUCTOR LASER, SURFACE-EMITTING SEMICONDUCTOR LASER DEVICE, OPTICAL TRANSMISSION APPARATUS, AND INFORMATION PROCESSING APPARATUS

CROSS-REFERENCE TO RELATED APPLICATIONS

This application is based on and claims priority under 35 USC 119 from Japanese Patent Application No. 2011-000380 filed Jan. 5, 2011.

BACKGROUND (i) Technical Field

The present invention relates to a surface-emitting semiconductor laser, a surface-emitting semiconductor laser device, an optical transmission apparatus, and an information processing apparatus.

(ii) Related Art

Surface-emitting semiconductor lasers are used as a light source of a communication apparatus or an image forming apparatus. The surface-emitting semiconductor laser used as such a light source works in a single transverse mode and requires high power and long lifetime. In a surface-emitting semiconductor laser of a selective oxidation type, the single transverse mode is acquired by reducing an oxide-aperture diameter of a current-confining layer up to about 2 to 3 microns, but it is difficult to stably acquire optical power of 3 mW or more with such a small oxide aperture.

SUMMARY

According to an aspect of the invention, there is provided a surface-emitting semiconductor laser including: a substrate; a columnar structure that is formed on a main surface of the substrate, the columnar structure having: a first semiconductor multi-layered reflector of a first conductivity type that is formed on the substrate; an active region that is formed on the first semiconductor multi-layered reflector; a second semiconductor multi-layered reflector of a second conductivity type, which is different from the first conductivity type, that is formed on the active region; and a current-confining layer that is formed in the columnar structure and that includes a conductive area surrounded with an oxidized area which is selectively oxidized; an annular first electrode that is formed on the top of the columnar structure, that is electrically connected to the second semiconductor multi-layered reflector, and that defines a light-emitting window; a first dielectric film that is formed of a material with a first refractive index $n_1$ and that covers the light-emitting window, a laser light generated at the surface-emitting semiconductor laser passing through the material with the first refractive index $n_1$; and a second dielectric film that is formed of a material with a second refractive index $n_2$ and that is formed on the first dielectric film, a laser light generated at the surface-emitting semiconductor laser passing through the material with the second refractive index $n_2$, wherein the second dielectric film has an asymmetrical shape having a long axis and a short axis on a plane parallel to the main surface of the substrate, the second dielectric film is located at a position overlapping with the conductive area, the second refractive index $n_2$ is greater than the first refractive index $n_1$, the thickness of the first dielectric film is an odd multiple of $\lambda/4 \cdot n_1$ (where $\lambda$ is an oscillation wavelength of the laser light), and the thickness of the second dielectric film is an odd multiple of $\lambda/4 \cdot n_2$.

BRIEF DESCRIPTION OF THE DRAWINGS

Exemplary embodiments of the present invention will be described in detail based on the following figures, wherein:

FIG. 4 shows a plan view illustrating a surface-emitting semiconductor laser according to a second modification of the first example of the invention and sectional views taken along lines A-A and B-B thereof;

FIG. 6 shows a plan view illustrating a surface-emitting semiconductor laser according to a second example of the invention and sectional views taken along lines A-A and B-B thereof;

FIGS. 7A and 7B are sectional views schematically illustrating the configurations of surface-emitting semiconductor laser devices in which an optical member is mounted on the surface-emitting semiconductor laser according to the examples of the invention;

DETAILED DESCRIPTION

Figure 1:
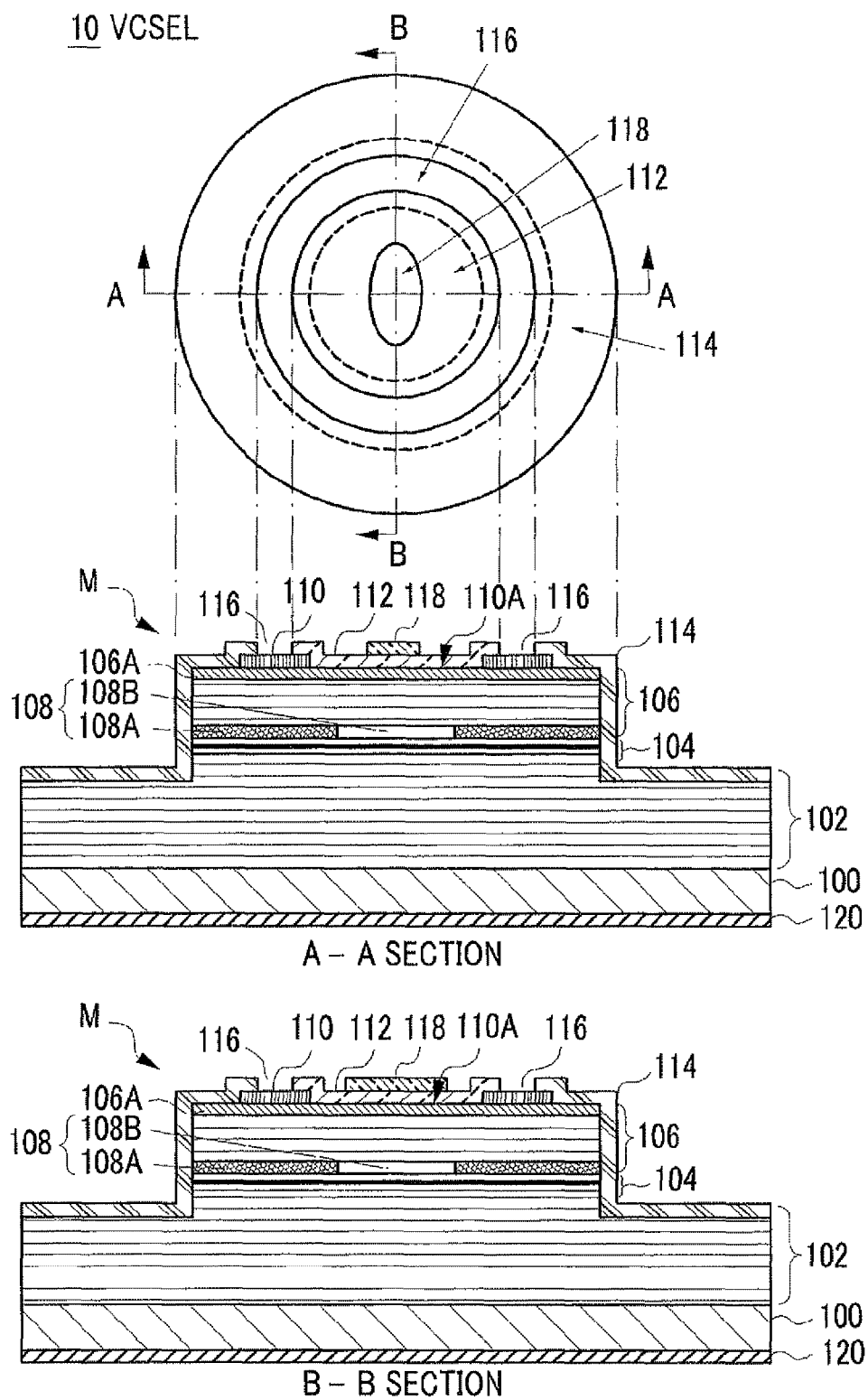
FIG. 1 shows a plan view of a surface-emitting semiconductor laser according to a first example of the invention and sectional views taken along lines A-A and B-B thereof.

Hereinafter, exemplary embodiments of the invention will be described with reference to the accompanying drawings. In the following description, a surface-emitting semiconductor laser of a selective oxidation type (VCSEL: Vertical Cavity Surface Emitting Laser) is exemplified and the surface-emitting semiconductor laser is referred to as VCSEL. In the drawings, scales are emphasized to facilitate the understanding of features of the invention and thus are not necessarily equal to the scales of actual devices.

EXAMPLES

FIG. 1 shows a schematic plan view of a VCSEL according to a first example of the invention and sectional views thereof. As shown in the drawing, in a VCSEL 10 according to this example, an n-type lower distributed Bragg reflector (hereinafter, referred to as "DBR") 102 in which AlGaAs layers having different Al compositions are alternately superimposed, an active region 104 including a quantum well layer interposed between upper and lower spacer layers formed on the lower DBR 102, and a p-type upper DBR 106 in which AlGaAs layers having different Al compositions are alternately superimposed on the active region 104 are stacked on an n-type GaAs substrate 100. The n-type lower DBR 102 is, for example, a stacked body of plural pairs of an $Al_{0.9}Ga_{0.1}As$ layer and an $Al_{0.3}Ga_{0.7}As$ layer, the thickness of the respective layers is $\lambda/4 \cdot n_r$ (where $\lambda$ represents an oscillation wavelength and nr represents a refractive index of a medium), and 40 pairs are alternately stacked. The carrier concentration after doping with silicon which is an n-type impurity is, for example, $3 \times 10^{18}$ cm$^{-3}$. The lower spacer layer of the active region 104 is, for example, an undoped $Al_{0.6}Ga_{0.4}As$ layer, the quantum well active layer is an undoped $Al_{0.11}Ga_{0.89}As$ quantum well layer and an undoped $Al_{0.3}Ga_{0.7}As$ barrier layer, the upper spacer layer is an undoped $Al_{0.6}Ga_{0.4}As$ layer. The p-type upper DBR 106 is, for example, a stacked body of plural pairs of an $Al_{0.9}Ga_{0.1}As$ layer and an $Al_{0.3}Ga_{0.7}As$ layer, the thickness of the respective layer is $\lambda/4 \cdot n_r$, and 24 pairs are alternately stacked. The carrier concentration after doping with carbon which is a p-type impurity is, for example, $3 \times 10^{18}$ cm$^{-3}$. A contact layer 106A formed of p-type GaAs is formed as the uppermost layer of the upper DBR 106 and a current-confining layer 108 formed of p-type AlAs is formed at the lowermost layer or an internal layer of the upper DBR 106.

A cylindrical mesa (columnar structure) M is formed on the substrate 100 by etching a semiconductor layer from the upper DBR 106 to the lower DBR 102. The etching for the mesa M may be performed up to at least a height at which the current-confining layer 108 is exposed from the side surface thereof. The current-confining layer 108 includes an oxidized area 108A exposed from the side surface of the mesa M and selectively oxidized from the side surface and a conductive area (oxide aperture) 108B surrounded with the oxidized area 108A. In the process of oxidizing the current-confining layer 108, the oxidation speed of the AlAs layer is higher than that of the AlGaAs layer and the oxidation progresses at a constant speed from the side surface of the mesa M to the inside. Accordingly, the two-dimensional shape in the plane of the conductive area 108B parallel to the main surface of the substrate 100 is a circular shape reflecting the outer shape of the mesa M and the center thereof is matched with the center in the axis direction of the mesa M, that is, the optical axis. The diameter of the conductive area 108B may be set to a value causing the high-order-transverse-mode oscillation and may be, for example, 5 microns or more in the wavelength band of 780 nm.

An annular p-side electrode 110 formed of metal is formed as the uppermost layer of the mesa M or on the top thereof. The p-side electrode 110 is formed of, for example, Au or Ti/Au stacked metal and comes in ohmic contact with the contact layer 106A of the upper DBR 106. A circular opening is formed at the center of the p-side electrode 110 and the opening defines a light-emitting window 110A from which light exits. Preferably, the center of the light-emitting window 110A is matched with the optical axis of the mesa M and the diameter of the light-emitting window 110A is greater than the diameter of the conductive area 108B.

A first dielectric film 112 of a circular pattern is formed to cover the light-emitting window 110A of the p-side electrode 110. The first dielectric film 112 is formed of a material that may transmit light of an oscillation wavelength and the thickness thereof is an odd multiple of an intra-medium wavelength $\lambda/4$, that is, $(2n-1)\lambda/4$ (where n is a positive integer). The outer diameter of the first dielectric film 112 is smaller than the outer diameter of the p-side electrode and is greater than the diameter of the light-emitting window 110A. Accordingly, the light-emitting window 110A is completely covered with the first dielectric film 112.

An insulating interlayer 114 is formed to cover the bottom and the side of the mesa M and the peripheral edge of the top. In the top of the mesa M, a circular contact hole 116 is formed in the insulating interlayer 114 to expose a part of the p-side electrode 110. The p-side electrode 110 is connected to a line not shown via the contact hole 116.

A second dielectric film 118 formed of a material that may transmit light of the oscillation wavelength is formed on the first dielectric film 112. The second dielectric film 118 preferably has an asymmetrical shape having a long axis and a short axis and the second dielectric film 118 is processed to form an elliptical shape in the first example. The second dielectric film 118 is formed at a position overlapping with the conductive area 108B as seen from the substrate 100 side, the center (the intersection of the long axis and the short axis) of the second dielectric film 118 is preferably matched with the optical axis, and the lengths of the long axis and the short axis of the second dielectric film 118 are smaller than the diameter D of the conductive area 108B. When the aspect ratio (long axis/short axis) of the second dielectric film 118 is N and the length of the short axis of the second dielectric film 118 is 1 micron, it is preferable to satisfy the relation of $1 < N < D$. That is, the length of the long axis is smaller than the diameter of the conductive area 108B.

The thickness of the second dielectric film 118 is an odd multiple of the intra-medium wavelength $\lambda/4$, that is, $(2n-1)\lambda/4$ (where n is a positive integer). In a preferred example, the second dielectric film 118 may be formed using the same material and the process as the insulating interlayer 114. An n-side electrode 120 electrically connected to the lower DBR 102 is formed on the rear surface of the substrate 100.

Here, when the refractive index of the first dielectric film 112 is $n_1$, the refractive index of the second dielectric film 118 is $n_2$, and the refractive index of the semiconductor layer (the contact layer 106A) of the upper DBR 108 is $n_3$, the relationship of $n_1 < n_2 < n_3$ is established. As described above, the thicknesses of the first and second dielectric films 112 and 118 are odd multiples of $\lambda/4$. As a result, the reflectance r1 of the area covered with the second dielectric film 118 is higher than the reflectance r2 of the area not covered with the second dielectric film 118. Accordingly, in the light-emitting window 110A, the oscillation in the vicinity of the optical axis in which the second dielectric film 118 is present is promoted and the oscillation in the peripheral area apart from the optical axis in which the second dielectric film 118 is not present is suppressed, whereby fundamental-transverse-mode light is output from the light-emitting window 110A. Since the second dielectric film 118 has an asymmetrical property with respect to the optical axis, an asymmetrical property is caused in reflectance difference (r1−r2) in the light-emitting window 110A and thus the polarization of the fundamental-transverse-mode light is controlled in the long axis direction.

It is preferable that materials causing an increase in the difference between the refractive indexes $n_1$ and $n_2$ of the first and second dielectric films 112 and 118 should be selected. Accordingly, the reflectance difference (r1−r2) between the area covered with the second dielectric film 118 and the area not covered with the second dielectric film may be made to be greater. For example, the first dielectric film 112 is formed of SiON and the second dielectric film 118 is formed of SiN. Otherwise, the first dielectric film 112 and the second dielectric film 118 may be formed by the use of combinations shown in FIG. 2.

When the upper DBR 106 is formed of 24 pairs of the $Al_{0.9}Ga_{0.1}As$ layer and the $Al_{0.3}Ga_{0.7}As$ layer, the first dielectric film 112 is formed of SiON (with a thickness of $\lambda/4$), and the second dielectric film 118 is formed of SiN (with a thickness of $\lambda/4$), the reflectance r1 of the area covered with the second dielectric film 118 is about 99.7% and the reflectance r2 of the area not covered with the second dielectric film 118 is about 99.2%. Since the reflectance necessary for the laser oscillation is typically 99.5%, the light may be easily oscillated in the vicinity of the optical axis of the second dielectric film 118 and the high-order-transverse-mode oscillation in the area apart from the optical axis is suppressed. A person skilled in the art may properly adjust the reflectance r1 and r2 by selecting the number of pairs of the upper DBR 106 or the materials of the first and second dielectric films 112 and 118.

The VCSEL used in a high-speed and high-quality printer requires a single-mode operation. In addition, in order to improve the printing performance in the future, there is a need for a VCSEL with long lifetime in which the power of the single-mode light is enhanced and the polarization thereof is stabilized. In order to enhance the power of the single-mode light and to elongate the lifetime, it is necessary to increase the diameter of the conductive area (oxide aperture) 108B. However, when the conductive area has an asymmetrical shape such as an ellipse, the diameter by which the single mode may be achieved is determined by the long axis. Accordingly, when the oxide aperture has an elliptical shape, the short axis thereof should be smaller than the maximum diameter by which the single mode may be achieved and thus the area thereof is smaller than the area of the conductive area having a circular shape with the length of the long axis as a diameter. Therefore, as the area of the conductive area becomes smaller, the resistance becomes greater and the influence of the self-heating of an element becomes greater. As a result, the optical output lifetime is shorter than that of the oxide aperture having a circular shape. In the present example, in order to implement a surface-emitting semiconductor laser with the enhanced power of the single-mode light, with the stable polarization, and with the elongated lifetime, the conductive area (oxide aperture) 108B is formed in a circular shape not having the anisotropic property to stabilize the polarization relative to the asymmetrical dielectric film of the light-emitting window 110A.

It has been known that a transparent dielectric film is added to a part of the light-emitting window to give an asymmetrical property to the reflectance. However, in this case, a part is present in which the semiconductor layer is exposed and thus the reliability thereof is poor due to the influence of moisture or the like. In the present example, since the entire area of the light-emitting window 110A is completely covered and protected with the first dielectric film 112, the semiconductor layer is not influenced by moisture. An example where the reflectance difference is made using the same material and the thickness difference thereof was known in the past, but it is difficult to control the thickness difference with high precision. In the present example, it is possible to relatively easily control the fundamental transverse mode by controlling the thicknesses of two different dielectric films 112 and 118.

Figures 2, 3:
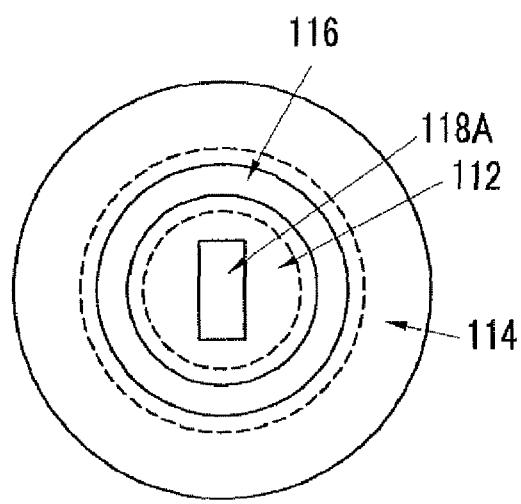
FIG. 2 is a diagram illustrating examples of a combination of a first dielectric film and a second dielectric film.
FIG. 3 is a plan view illustrating a surface-emitting semiconductor laser according to a first modification of the first example of the invention.

FIG. 3 is a plan view illustrating the VCSEL according to a first modification of the first example. In the VCSEL 10A shown in FIG. 3, the second dielectric film 118A is formed in a rectangular shape having a long axis and a short axis. The configuration except for the rectangular shape of the second dielectric film 118A is the same as shown in FIG. 1. Preferably, the intersection of diagonals of the second dielectric film 118A is matched with the optical axis and the lengths of the long side and the short side thereof are smaller than the diameter of the conductive area 108B. In this modification, the light output from the light-emitting window 110A is controlled in the fundamental transverse mode and is controlled in polarization in the long side direction by means of the anisotropy in the gain of the second dielectric film 118A.

FIG. 4 shows a plan view illustrating a VCSEL according to a second modification of the first example of the invention and sectional views taken along lines A-A and B-B thereof. The configuration of the VCSEL 10B according to the second modification is different from the configuration of the VCSEL 10 shown in FIG. 1, in that the mesa M1 is formed in an elliptical shape. By forming the mesa M1 in an elliptical shape, the two-dimensional shape of the conductive area 108B surrounded with the oxidized area 108A in the mesa M1 is elliptical. The long axis direction of the conductive area 108E is matched with the long axis direction of the second dielectric film 118 and the lengths of the long axis and the short axis of the second dielectric film 118 are smaller than the lengths of the long axis and the short axis of the conductive area 108B, respectively. In the second modification, since the conductive area 108E has an asymmetrical property having the long axis and the short axis with respect to the optical axis, the gain thereof is asymmetrical and it is thus possible to more effectively control the polarization in cooperation with the second dielectric film 118. Although the light-emitting window 110A of the p-side electrode 110 has an elliptical shape in FIG. 4, the light-emitting window 110A may have a circular shape as shown in FIG. 1.

Figure 5:
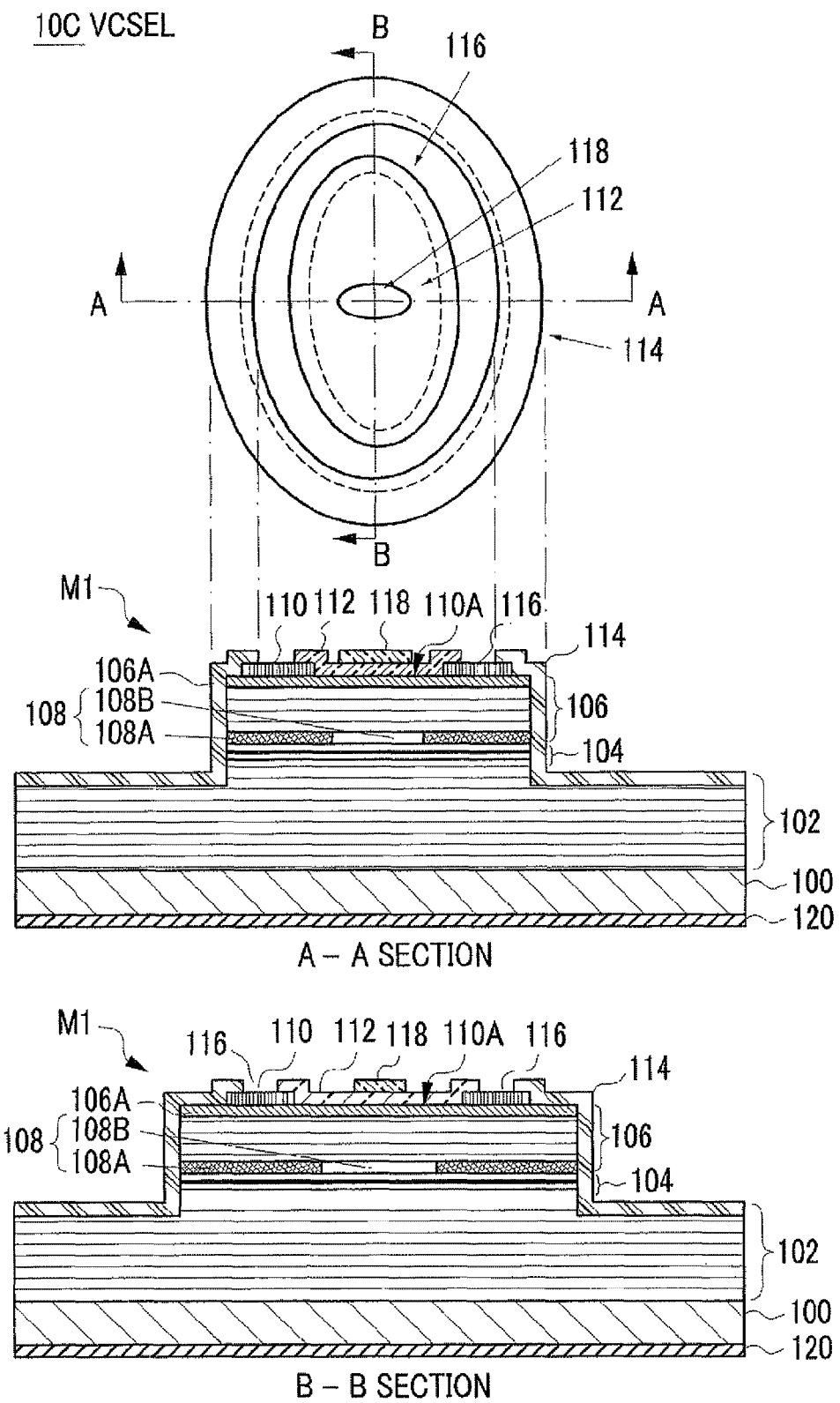
FIG. 5 shows a plan view illustrating a surface-emitting semiconductor laser according to a third modification of the first example of the invention and sectional views taken along lines A-A and B-B thereof.

FIG. 5 is a diagram illustrating a VCSEL according to a third modification of the first example. The VCSEL 10C according to the third modification is equal to the VCSEL according to the second modification in that the mesa M1 has an elliptical shape and the conductive area 108E has an elliptical shape, but is different from the VCSEL according to the second modification in the orientation of the second dielectric film 118. That is, the long axis direction of the second dielectric film 118 is perpendicular to the long axis direction of the conductive area 108B. In the third modification, the length of the long axis of the second dielectric film 118 is smaller than the length of the short axis of the conductive area 108B and the length of the short axis of the second dielectric film 118 is smaller than length of the long axis of the conductive area 108B. Preferably, by setting the area of the conductive area 108B to be greater, the gain of the laser oscillation is increased, the fundamental transverse mode is controlled by the second dielectric film 118, and the laser light of which the polarization is controlled is output.

A second example of the invention will be described below. FIG. 6 shows a plan view illustrating a VCSEL 12 according to the second example of the invention and sectional views taken along lines A-A and B-B thereof. The same elements as in the first example are referenced by the same reference numerals. The second example is different from the first example, in the configuration of first and second dielectric films 210 and 220 formed in the light-emitting window 110A. In the second example, the first dielectric film 210 covers the entire light-emitting window 110A defined by the opening of the p-side electrode 110 and serves as a surface protecting film. The second dielectric film 220 is formed on the first dielectric film 210. An opening 220A exposing the first dielectric film 210 is formed at the center of the second dielectric film 220. The opening 220A is an asymmetrical shape having a long axis and a short axis and the opening 220A is formed in an elliptical shape herein. The opening 220A is positioned to overlap with the conductive area 108B as seen from the substrate 100 side, the center of the opening 220A (the intersection of the short axis and the long axis) is preferably matched with the center (the optical axis) of the conductive area 108B, and the lengths of the long axis and the short axis of the opening 220A are smaller than the diameter of the conductive area 108B.

It is preferable that the refractive index $n_2$ of the second dielectric film 220 is greater than the refractive index $n_1$ of the first dielectric film 210 ($n_2 > n_1$), the optical thickness of the first dielectric film 210 is an integral multiple of λ/2, and the optical thickness of the second dielectric film 220 is an odd multiple of λ/4.

The reflectance r2 of the area covered with the second dielectric film 220 may be set to be smaller than the reflectance r1 of the opening 220A of the second dielectric film 220. Accordingly, it is possible to suppress the high-order-transverse-mode oscillation caused at a position apart from the optical axis. As a result, the fundamental-transverse-mode light is output from the light-emitting window 110A. Since the opening 220A of the second dielectric film 220 has an asymmetrical shape, the reflectance is asymmetrical and the fundamental-transverse-mode light is controlled in polarization. The first and second dielectric films 210 and 220 are preferably formed of materials having refractive indexes causing an increase in reflectance difference r1-r2.

The first to third modifications of the first example may be applied to the VCSEL according to the second example. The opening 220A of the second dielectric film 220 may have a rectangular shape having a long side and a short side as in the first modification (see FIG. 3). By forming the mesa M in an elliptical shape as in the second modification (see FIGS. 4 and 5), the two-dimensional shape of the conductive area 108B may be set to an elliptical shape.

In the first and second examples, the elliptical shape and the rectangular shape are exemplified as the asymmetrical shape having a long axis and a short axis, but other shapes may be employed. In the first and second examples, the current-confining layer 108 formed of AlAs is exemplified, but the current-confining layer 108 may be formed of an AlGaAs layer having an Al composition higher than the Al compositions of other DBRs. The diameter of the conductive area (oxide aperture) 108B of the current-confining layer 108 may be properly changed depending on the required optical power. In the above-mentioned examples, the GaAs-based VCSEL is exemplified, but the invention may be applied to a VCSEL formed of other III-V group compound semiconductor. In the above-mentioned examples, the n-side electrode is formed on the rear surface of the n-type GaAs substrate, but the n-side electrode may be formed on the bottom of the mesa so as to electrically be connected to the lower DBR 102. In this case, the substrate may have a semi-insulating property. In the above-mentioned examples, the single-spot VCSEL is exemplified, but a multi-spot VCSEL or VCSEL array in which plural mesas (light-emitting portions) are formed on the substrate may be employed.

A surface-emitting semiconductor laser device, an optical information processing device, and an optical transmission apparatus employing the VCSEL according to this example will be described below with reference to the accompanying drawings. FIG. 7A is a sectional view schematically illustrating the configuration of a surface-emitting semiconductor laser device mounted (packaged) with the VCSEL and an optical member. The surface-emitting semiconductor laser device 300 fixes a chip 310 having a VCSEL formed thereon to a disc-like metal stem 330 with a conductive adhesive 320. The conductive leads 340 and 342 are inserted into through-holes (not shown) formed through the stem 330, one lead 340 is electrically connected to the n-side electrode of the VCSEL, and the other lead 342 is electrically connected to the p-side electrode. A box-like hollow cap 350 is fixed onto the stem 330 including the chip 310 and a ball lens 360 as the optical member is fixed into an opening 352 at the center of the cap 350. The optical axis of the ball lens 360 is positioned to be almost matched with the center of the chip 310. When a forward voltage is applied across the leads 340 and 342, laser light exits in a vertical direction from the chip 310. The distance between the chip 310 and the ball lens 360 is adjusted so that the ball lens 360 lies within a spread angle θ of the laser light from the chip 310. The cap may include a light-receiving element or a temperature sensor used to monitor the emission state of the VCSEL.

FIG. 7B illustrates the configuration of another surface-emitting semiconductor laser device. In the surface-emitting semiconductor laser device 302 shown in the drawing, a flat glass 362 is fixed into the central opening 352 of the cap 350 instead of using the ball lens 360. The center of the flat glass 362 is positioned to be almost matched with the center of the chip 310. The distance between the chip 310 and the flat glass 362 is adjusted so that the aperture diameter of the flat glass 362 is equal to or greater than the spread angle θ of the laser light from the chip 310.

Figure 8:
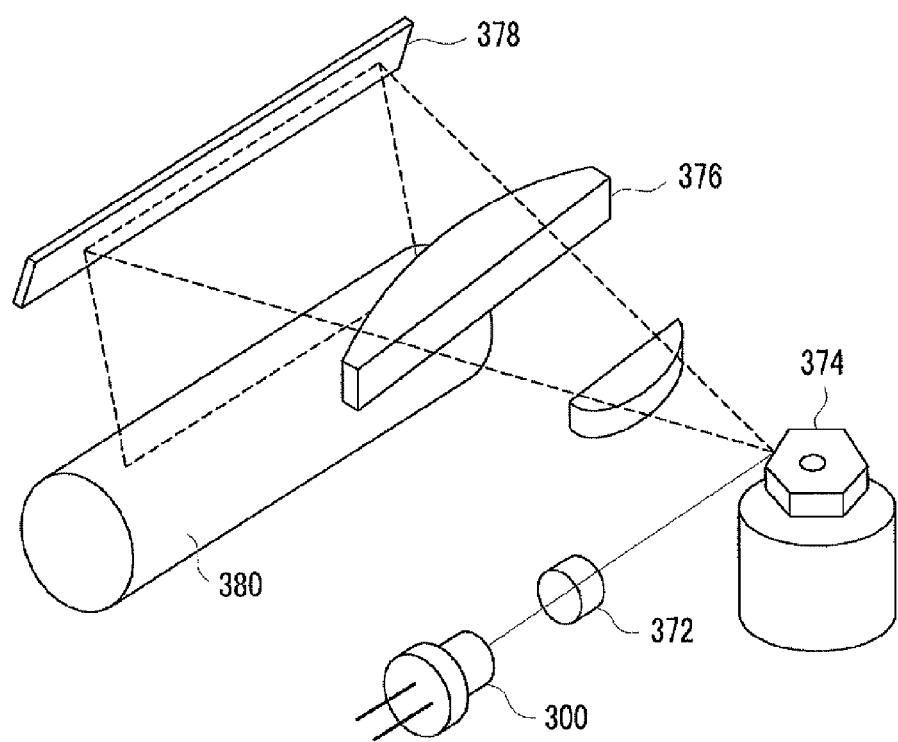
FIG. 8 is a diagram illustrating the configuration example of a light source unit employing the surface-emitting semiconductor laser according to the examples of the invention.

FIG. 8 is a diagram illustrating an example where the VCSEL is applied to a light source unit of an optical information processing device. The optical information processing device 370 includes a collimator lens 372 receiving the laser light from the surface-emitting semiconductor laser device 300 or 302 mounted with the VCSEL as shown in FIG. 7A or 7B, a polygonal mirror 374 rotating at a constant speed and reflecting a beam of light from the collimator lens 372 at a constant spread angle, a fθ lens 376 receiving the laser light from the polygonal mirror 374 and illuminating a mirror 378, a line-shaped mirror 378, and a photosensitive drum (recording medium) 380 forming a latent image on the basis of the reflected light from the mirror 378. In this way, the VCSEL may be used as a light source of an optical information processing device such as a copier or a printer having an optical system focusing the laser light from the VCSEL onto the photosensitive drum and a mechanism scanning the photosensitive drum with the focused laser light.

Figure 9:
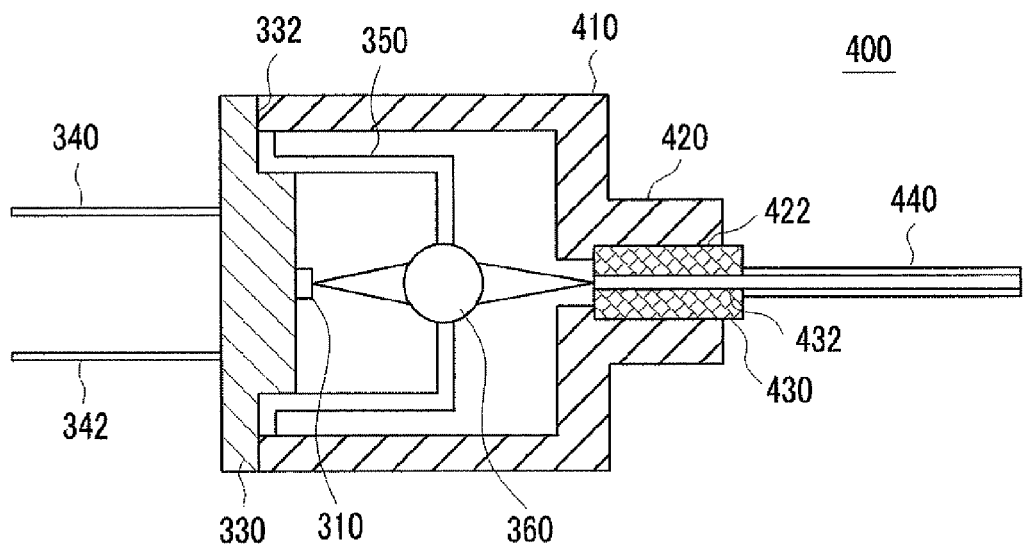
FIG. 9 is a sectional view schematically illustrating the configuration of an optical transmission apparatus employing the surface-emitting semiconductor laser device shown in FIG. 7A.

FIG. 9 is a sectional view schematically illustrating the configuration of an optical transmission apparatus employing the surface-emitting semiconductor laser device shown in FIG. 7A. The optical transmission apparatus 400 includes a cylindrical case 410 fixed to the stem 330, a sleeve 420 formed on the end face of the case 410 as a body, a ferrule 430 held in an opening 422 of the sleeve 420, and an optical fiber cable 440 held by the ferrule 430. An end of the case 410 is fixed to a flange 332 formed in the peripheral direction of the stem 330. The ferrule 430 is accurately positioned in the opening 422 of the sleeve 420 and the optical axis of the optical fiber cable 440 is matched with the optical axis of the ball lens 360. The core of the optical fiber cable 440 is held in a through-hole 432 of the ferrule 430. The laser light emitted from the surface of the chip 310 is focused by the ball lens 360, and the focused light is incident on the core of the optical fiber cable 440 and is transmitted thereby. Although the ball lens 360 is used in the above-mentioned example, other lenses such as a biconvex lens or a plano-convex lens may be used. The optical transmission apparatus 400 may include a driving circuit used to apply an electrical signal to the leads 340 and 342. The optical transmission apparatus 400 may have a receiving function of receiving an optical signal via the optical fiber cable 440.

While the exemplary embodiment of the invention has been described, the invention is not limited to the specific embodiment, and may be modified in various forms without departing from the concept of the invention described in the appended claims.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A surface-emitting semiconductor laser comprising:
a substrate;
a columnar structure that is formed on a main surface of the substrate, the columnar structure having:
  a first semiconductor multi-layered reflector of a first conductivity type that is formed on the substrate,
  an active region that is formed on the first semiconductor multi-layered reflector,
  a second semiconductor multi-layered reflector of a second conductivity type, which is different from the first conductivity type, that is formed on the active region, and
  a current-confining layer that is formed in the columnar structure and that includes a conductive area surrounded with an oxidized area which is selectively oxidized;
an annular first electrode that is formed on a top of the columnar structure, that is electrically connected to the second semiconductor multi-layered reflector, and that defines a light-emitting window;
a first dielectric film that is formed of a material with a first refractive index $n_1$ and that covers the light-emitting window, a laser light generated at the surface-emitting semiconductor laser passing through the material with the first refractive index $n_1$; and
a second dielectric film that is formed of a material with a second refractive index $n_2$ and that is formed on the first dielectric film, the laser light generated at the surface-emitting semiconductor laser passing through the material with the second refractive index $n_2$,
wherein the second dielectric film has an asymmetrical shape having a long axis and a short axis on a plane parallel to the main surface of the substrate, the second dielectric film is located at a position overlapping with the conductive area, the second refractive index $n_2$ is greater than the first refractive index $n_1$, a thickness of the first dielectric film is an odd multiple of $\lambda/4 \cdot n_1$ (where $\lambda$ is an oscillation wavelength of the laser light), and a thickness of the second dielectric film is an odd multiple of $\lambda/4 \cdot n_2$.

2. The surface-emitting semiconductor laser according to claim 1, wherein when a two-dimensional shape of the conductive area is circular, an intersection of the long axis and the short axis in the second dielectric film is in a center of the conductive area, and a length of the long axis of the second dielectric film is smaller than a diameter of the conductive area.

3. The surface-emitting semiconductor laser according to claim 1, wherein when a two-dimensional shape of the conductive area is an asymmetrical shape having a long axis and a short axis, the intersection of the long axis and the short axis in the second dielectric film is in the intersection of the long axis and the short axis of the conductive area, the long-axis direction of the second dielectric film is parallel to the long-axis direction of the conductive area, and a length of the long axis of the second dielectric film is smaller than a length of the long axis of the conductive area.

4. The surface-emitting semiconductor laser according to claim 1, wherein the second semiconductor multi-layered reflector includes a semiconductor layer having a third refractive index $n_3$ that is greater than the second refractive index $n_2$.

5. A surface-emitting semiconductor laser comprising:
a substrate;
a columnar structure that is formed on a main surface of the substrate, the columnar structure having:
  a first semiconductor multi-layered reflector of a first conductivity type that is formed on the substrate,
  an active region that is formed on the first semiconductor multi-layered reflector,
  a second semiconductor multi-layered reflector of a second conductivity type, which is different from the first conductivity type, that is formed on the active region, and
  a current-confining layer that is formed in the columnar structure and that includes a conductive area surrounded with an oxidized area which is selectively oxidized;
an annular first electrode that is formed on a top of the columnar structure, that is electrically connected to the second semiconductor multi-layered reflector, and that defines a light-emitting window;
a first dielectric film that is formed of a material with a first refractive index $n_1$ and that covers the light-emitting window, a laser light generated at the surface-emitting semiconductor laser passing through the material with the first refractive index $n_1$; and
a second dielectric film that is formed of a material with a second refractive index $n_2$ and that is formed on the first dielectric film, the laser light generated at the surface-emitting semiconductor laser passing through the material with the second refractive index $n_2$,
wherein the second dielectric film has an asymmetrical opening having a long axis and a short axis on a plane parallel to the main surface of the substrate, the opening exposes the first dielectric film in the light-emitting window at a position overlapping with the conductive area, the second refractive index $n_2$ is greater than the first refractive index $n_1$, a thickness of the first dielectric film is a positive integral multiple of $\lambda/2 \cdot n_1$ (where $\lambda$ is an oscillation wavelength of the laser light), and a thickness of the second dielectric film is an odd multiple of $\lambda/4 \cdot n_2$.

6. The surface-emitting semiconductor laser according to claim 5, wherein when a two-dimensional shape of the conductive area is circular, an intersection of the long axis and the short axis in the opening of the second dielectric film is in a center of the conductive area, and the length of the long axis of the opening of the second dielectric film is smaller than a diameter of the conductive area.

7. The surface-emitting semiconductor laser according to claim 5, wherein when a two-dimensional shape of the conductive area is an asymmetrical shape having a long axis and a short axis, the intersection of the long axis and the short axis in the opening of the second dielectric film is in the intersection of the long axis and the short axis of the conductive area, the long-axis direction of the opening of the second dielectric film is parallel to the long-axis direction of the conductive area, and a length of the long axis of the opening of the second dielectric film is smaller than a length of the long axis of the conductive area.

8. The surface-emitting semiconductor laser according to claim 5, wherein the second semiconductor multi-layered reflector includes a semiconductor layer having a third refractive index $n_3$ that is greater than the second refractive index $n_2$.

9. A surface-emitting semiconductor laser device comprising:
- the surface-emitting semiconductor laser according to claim 1; and
- an optical member on which light from the surface-emitting semiconductor laser is incident.

10. A surface-emitting semiconductor laser device comprising:
- the surface-emitting semiconductor laser according to claim 5; and
- an optical member on which light from the surface-emitting semiconductor laser is incident.

11. An optical transmission apparatus comprising:
- the surface-emitting semiconductor laser device according to claim 9; and
- a transmission unit that transmits laser light emitted from the surface-emitting semiconductor laser device through an optical medium.

12. An optical transmission apparatus comprising:
- the surface-emitting semiconductor laser device according to claim 10; and
- a transmission unit that transmits laser light emitted from the surface-emitting semiconductor laser device through an optical medium.

13. An information processing apparatus comprising:
- the surface-emitting semiconductor laser according to claim 1;
- a focusing unit that focuses laser light emitted from the surface-emitting semiconductor laser on a recording medium; and
- a mechanism that scans the recording medium with the laser light focused by the focusing unit.

14. An information processing apparatus comprising:
- the surface-emitting semiconductor laser according to claim 5;
- a focusing unit that focuses laser light emitted from the surface-emitting semiconductor laser on a recording medium; and
- a mechanism that scans the recording medium with the laser light focused by the focusing unit.

* * * * *